US008203383B2

(12) United States Patent
Oswal et al.

(10) Patent No.: US 8,203,383 B2
(45) Date of Patent: Jun. 19, 2012

(54) REDUCING THE EFFECT OF BULK LEAKAGE CURRENTS

(75) Inventors: Sandeep Oswal, Pune (IN); Neetin Agrawal, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 395 days.

(21) Appl. No.: 12/624,087

(22) Filed: Nov. 23, 2009

(65) Prior Publication Data

US 2010/0156389 A1 Jun. 24, 2010

(51) Int. Cl.
*H03F 3/45* (2006.01)

(52) U.S. Cl. ......................... 330/253; 330/288; 323/276

(58) Field of Classification Search .................. 330/149, 330/252–258, 261, 288, 300; 327/530, 538–545, 327/362, 563, 307, 312; 323/266, 272–276, 323/312–315, 282–285, 288

See application file for complete search history.

(56) References Cited

U.S. PATENT DOCUMENTS

| | | | | |
|---|---|---|---|---|
| 5,187,448 | A * | 2/1993 | Brooks et al. | 330/258 |
| 5,351,011 | A * | 9/1994 | Seevinck et al. | 330/253 |
| 6,636,098 | B1 * | 10/2003 | Kizer | 327/345 |
| 6,703,813 | B1 * | 3/2004 | Vladislav et al. | 323/270 |
| 2008/0191802 | A1 | 8/2008 | Kinget | |
| 2008/0258826 | A1 | 10/2008 | Chatterjee et al. | |
| 2009/0015329 | A1 | 1/2009 | Chatterjee et al. | |

FOREIGN PATENT DOCUMENTS

WO WO2006034371 3/2006

* cited by examiner

*Primary Examiner* — Rajnikant Patel

(74) *Attorney, Agent, or Firm* — John J. Patti; Wade J. Brady, III; Frederick J. Telecky, Jr.

(57) ABSTRACT

A current mirroring circuit is provided. The circuit generally comprises a current source; a first drain extended (DE) MOS transistor, a second DE MOS transistor, a current mirror, and differential amplifier. The current source is generally coupled to the current source at its drain, while the current mirror that is coupled to the sources of the first and second DE MOS transistors and to the current source. The differential amplifier generally has a first input that is coupled to the source of the first DE MOS transistor, a second input that is coupled to the source of the second DE MOS transistor, a first output that is coupled to the gate of the second DE MOS transistor, and a second output that is coupled to the gate of the first DE MOS transistor.

9 Claims, 2 Drawing Sheets

REDUCING THE EFFECT OF BULK LEAKAGE CURRENTS

CROSS-REFERENCE TO RELATED APPLICATIONS

This patent application claims priority from India Provisional Application No. 2905/CHE/2008, filed 24 Nov. 2008, the entirety of which is incorporated herein by reference.

TECHNICAL FIELD

The invention relates generally to reducing bulk leakage currents and, more particularly, to accounting for errors in current mirrors due to bulk leakage currents.

BACKGROUND

Referring to FIG. 1 of the drawings, the reference numeral 100 generally designates a conventional current mirror. The current mirror circuit 100 is generally employed to mirror an accurate input current IIN for an external circuit 104 that has a desired minimum accuracy. To accomplish this, current mirror circuit 100 employs a pair 102 of cascoded drain extended (DE) NMOS transistors Q1 and Q2. These transistors Q1 and Q2 are coupled to the drains of the current mirror (which is generally comprised of NMOS transistors Q3 and Q4).

A problem with this circuit results from the bulk leakage currents of the DE NMOS transistors Q1 and Q2. In operation, the input current IIN is generally the sum of current through transistor Q1 or I1 and the bulk leakage current I2 of transistor Q1. The current I1 is mirrored, while current I2 is not. Instead, transistor Q2 has a bulk leakage current I4, which may not be the same as current I2. This results in the output current being approximately equal to the sum of current I1 and current I4, which is not necessarily equal to the input current IIN. Generally, this output current is IIn+I4−I2. Thus, there are inaccuracies in the mirrored current due to the deleterious effects of bulk leakage currents.

Some other examples of conventional circuits are PCT Publ. No. WO/2006034371; and U.S. Patent Pre-Grant Publ. Nos. 2008/0191802; 2008/0258826; and 2009/0015329.

SUMMARY

A preferred embodiment of the present invention, accordingly, provides an apparatus. The apparatus comprises a current source; a first drain extended (DE) MOS transistor that is coupled to the current source at its drain; a second DE MOS transistor; a first current mirror transistor that is coupled to the source of the first DE MOS transistor at its drain and that is coupled to the current source at its gate; a second current mirror transistor that is coupled to the source of the second DE MOS transistor at its drain and that is coupled to the current source at its gate; a reference circuit that is coupled to the drain of the second DE MOS transistor and that generates a reference voltage at its output; a differential amplifier having: a first input that is coupled to the source of the first DE MOS transistor; a second input that is coupled to the source of the second DE MOS transistor; a reference input that is coupled to the output of the reference circuit; a first output that is coupled to the gate of the second DE MOS transistor; and a second output that is coupled to the gate of the first DE MOS transistor.

In accordance with a preferred embodiment of the present invention, the apparatus further comprises a level shifter coupled between the current source and the gates of the first and second current mirror transistors.

In accordance with a preferred embodiment of the present invention, the reference circuit further comprises a voltage divider.

In accordance with a preferred embodiment of the present invention, the first and second DE MOS transistors are DE NMOS transistors.

In accordance with a preferred embodiment of the present invention, an apparatus is provided. The apparatus comprises a current source; a first drain extended (DE) MOS transistor that is coupled to the current source at its drain; a second DE MOS transistor; current mirror that is coupled to the sources of the first and second DE MOS transistors and to the current source; a differential amplifier having: a first input that is coupled to the source of the first DE MOS transistor; a second input that is coupled to the source of the second DE MOS transistor; a first output that is coupled to the gate of the second DE MOS transistor; and a second output that is coupled to the gate of the first DE MOS transistor.

In accordance with a preferred embodiment of the present invention, the current mirror further comprises: a first current mirror transistor that is coupled to the source of the first DE MOS transistor at its drain and that is coupled to the current source at its gate; and a second current mirror transistor that is coupled to the source of the second DE MOS transistor at its drain and that is coupled to the current source at its gate.

In accordance with a preferred embodiment of the present invention, the apparatus further comprises a reference circuit that is coupled to the drain of the second DE MOS transistor and to a reference input for the differential amplifier.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1:
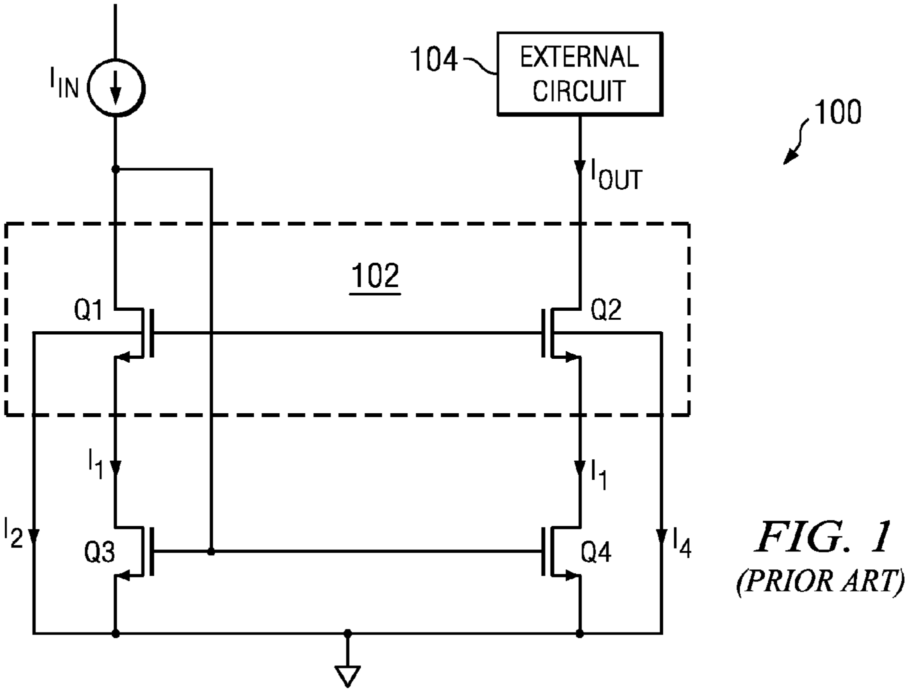
FIG. 1 (PRIOR ART)
FIG. 1 is a conventional current mirror circuit.

Refer now to the drawings wherein depicted elements are, for the sake of clarity, not necessarily shown to scale and wherein like or similar elements are designated by the same reference numeral through the several views.

Figure 3:
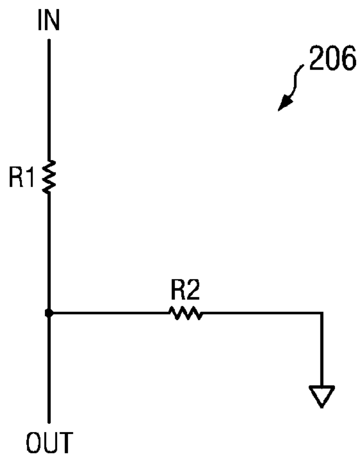
FIG. 3 is circuit diagram of an example the reference circuit of FIG. 2.
Figure 2:
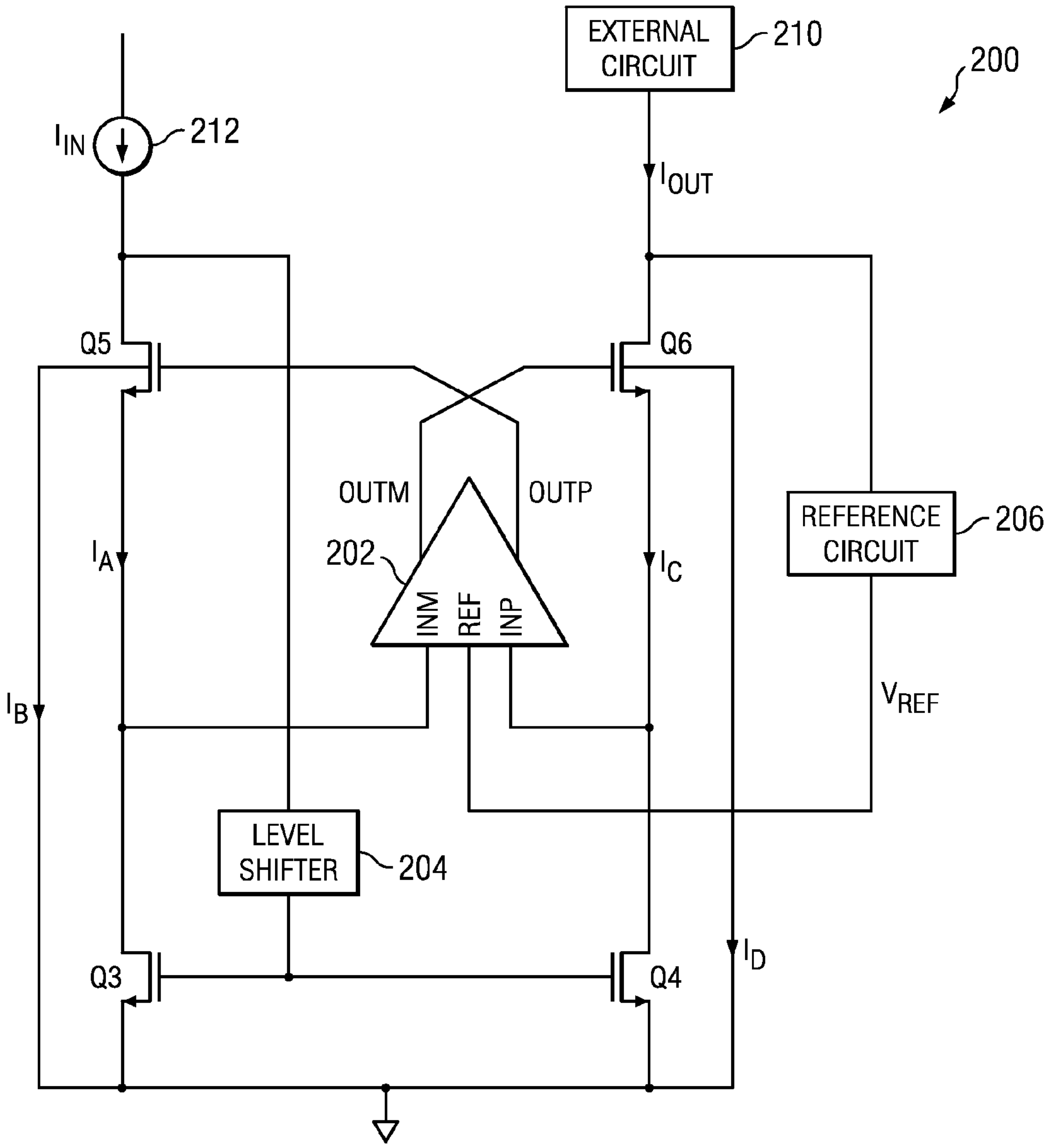
FIG. 2 is circuit diagram of an example of a current mirror circuit in accordance with a preferred embodiment of the present invention.

Turning to FIGS. 2 and 3 of the drawings, a 3.3V CMOS current mirror circuit 200 in accordance with a preferred embodiment of the present invention can be seen. As with circuit 100, circuit 200 is generally employed to mirror an input current IIN from current source 212, so as to provide output current IOUT to external circuits 210 (such as light emitting diodes or LEDs). Some advantages of the circuit 200 over circuit 100 are that (1) circuit 200 generally provides correction irrespective of process corners and temperature; (2) circuit 200 generally provides continuous feedback corrections to very high accuracy; and (3) circuit 200 has a higher output impedance than circuit 100, which reduces current mismatching that is generally caused by the drain-source voltage mismatch of the current mirror.

Circuit 100 and circuit 200 have several components in common; however, there are some differences. When compared to circuit 100, the cascoded transistors Q1 and Q2 of circuit 100 are replaced with drain extended (DE) MOS transistors Q5 and Q6, differential amplifier 202, and reference circuit 206. Preferably, current IIN is input into the drain of transistor Q5, and the output current IOUT is provided through the drain of transistor Q6. The differential amplifier 202 is coupled to the source of transistor Q5 at an input or input terminal (preferably the negative input terminal), while the source of transistor Q6 is coupled to an input or input terminals (preferably the positive input terminal) of the differential amplifier 202. The reference circuit 206 (which preferably employs a voltage divider comprised of resistors R1 and R2) is coupled to the drain of transistor Q6 to generate a reference voltage VREF for an input (preferably a reference input) of the differential amplifier. An output (preferably the positive output) of differential amplifier 202 is coupled to the gate of transistor Q5, while another output (preferably the negative output) is coupled to the gate of transistor Q6. Additionally, a level shifter 204 is provided between the current source 212 and the current mirror (the gates of transistors Q3 and Q3).

Figure 4:
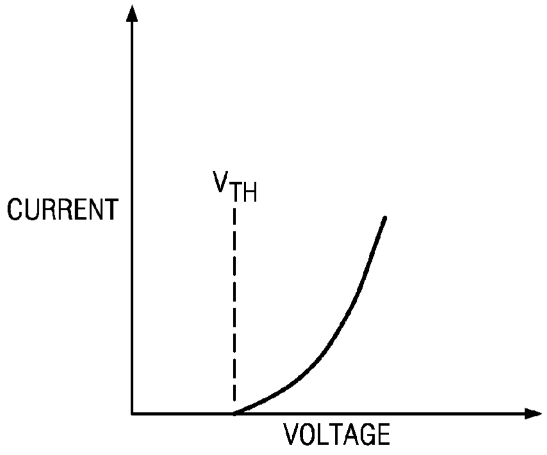
FIG. 4 is an IV diagram for a MOS transistor depicting the bulk-source leakage current versus drain-source voltage.

The bulk-drain leakage current in a MOS transistor (i.e., transistor Q5) is a function of the drain-source voltage $V_{DS}$, as shown in FIG. 4. As can be seen, the bulk-drain leakage current for a MOS transistor is zero if drain-source voltage $V_{DS}$ is less that threshold voltage $V_{TH}$. For drain-source voltage $V_{DS}$ greater than threshold voltage $V_{TH}$, the bulk-drain leakage current increases exponentially. In operation, the drain-source voltage $V_{DS}$ of transistor Q5 is generally less than the threshold voltage, thus bulk leakage current $I_B$ is about 0A. As a result, the output current $I_{OUT}$ is generally equal to the sum of the input current $I_{IN}$ and bulk leakage current $I_D$. The bulk leakage current $I_D$, though, can be reduced by keeping the drain-source voltage $V_{DS}$ of transistor Q6 less than the threshold voltage. To accomplish this, the reference circuit 206, measures the drain voltage of transistor Q6. Accordingly, reference circuit 206 generates reference voltage VREF such that if reference voltage VREF becomes the source voltage of transistor Q6, then the drain-source voltage $V_{DS}$ for transistor Q6 is less than the threshold voltage $V_{TH}$ for transistor Q6. The amplifier 202 sets the sources of transistors Q6 and Q5 to be equal to reference voltage VREF, which generally ensures that the drain-source $V_{DS}$ for transistor Q6 is less than the threshold voltage $V_{TH}$ and which causes current $I_D$ to be zero. In doing so, amplifier 202 also generates appropriate voltages OUTP and OUTM so that transistors Q6 and Q5 are properly biased.

Reference circuit 206 may also carry a fraction of current IOUT. This can make current IOUT inaccurate compared to current IIN. To generally avoided this inaccuracy, reference circuit 206 should offer high impedance to external circuit 210 so that only a negligible fraction of current IOUT can flow through reference circuit 206. Moreover, level shifter 204 may optionally be provided to bias the gates of transistors Q3 and Q4.

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Accordingly, it is appropriate that the appended claims be construed broadly and in a manner consistent with the scope of the invention.

The invention claimed is:

1. An apparatus comprising:

a current source;

a first drain extended (DE) MOS transistor that is coupled to the current source at its drain;

a second DE MOS transistor;

a first current mirror transistor that is coupled to the source of the first DE MOS transistor at its drain and that is coupled to the current source at its gate;

a second current mirror transistor that is coupled to the source of the second DE MOS transistor at its drain and that is coupled to the current source at its gate;

a reference circuit that is coupled to the drain of the second DE MOS transistor and that generates a reference voltage at its output;

a differential amplifier having:

a first input that is coupled to the source of the first DE MOS transistor;

a second input that is coupled to the source of the second DE MOS transistor;

a reference input that is coupled to the output of the reference circuit;

a first output that is coupled to the gate of the second DE MOS transistor; and a second output that is coupled to the gate of the first DE MOS transistor.

2. The apparatus of claim 1, wherein the apparatus further comprises a level shifter coupled between the current source and the gates of the first and second current mirror transistors.

3. The apparatus of claim 1, wherein the reference circuit further comprises a voltage divider.

4. The apparatus of claim 1, wherein the first and second DE MOS transistors are DE NMOS transistors.

5. An apparatus comprising:

a current source;

a first DE MOS transistor that is coupled to the current source at its drain;

a second DE MOS transistor;

a current mirror that is coupled to the sources of the first and second DE MOS transistors and to the current source;

a differential amplifier having:

a first input that is coupled to the source of the first DE MOS transistor;

a second input that is coupled to the source of the second DE MOS transistor;

a first output that is coupled to the gate of the second DE MOS transistor; and a second output that is coupled to the gate of the first DE MOS transistor; and a reference circuit that is coupled to the drain of the second DE MOS transistor and to a reference input for the differential amplifier.

6. The apparatus of claim 5, wherein the current mirror further comprises:

a first current mirror transistor that is coupled to the source of the first DE MOS transistor at its drain and that is coupled to the current source at its gate; and a second current mirror transistor that is coupled to the source of the second DE MOS transistor at its drain and that is coupled to the current source at its gate.

7. The apparatus of claim 5, wherein the apparatus further comprises a level shifter coupled between the current source and the gates of the first and second current mirror transistors.

8. The apparatus of claim 5, wherein the reference circuit further comprises a voltage divider.

9. The apparatus of claim 5, wherein the first and second DE MOS transistors are DE NMOS transistors.

* * * * *